(12) United States Patent
Wang et al.

(10) Patent No.: US 12,205,991 B2
(45) Date of Patent: Jan. 21, 2025

(54) CELL STRUCTURE OF SILICON CARBIDE MOSFET DEVICE, AND POWER SEMICONDUCTOR DEVICE

(71) Applicant: ZHUZHOU CRRC TIMES SEMICONDUCTOR CO., LTD., Hunan (CN)

(72) Inventors: Yafei Wang, Hunan (CN); Changwei Zheng, Hunan (CN); Shasha Jiao, Hunan (CN); Chengzhan Li, Hunan (CN); Haihui Luo, Hunan (CN)

(73) Assignee: ZHUZHOU CRRC TIMES SEMICONDUCTOR CO., LTD., Zhuzhou (CN)

( * ) Notice: Subject to any disclaimer, the term of this patent is extended or adjusted under 35 U.S.C. 154(b) by 442 days.

(21) Appl. No.: 17/781,374

(22) PCT Filed: Jun. 10, 2020

(86) PCT No.: PCT/CN2020/095251
§ 371 (c)(1),
(2) Date: May 31, 2022

(87) PCT Pub. No.: WO2021/128748
PCT Pub. Date: Jul. 1, 2021

(65) Prior Publication Data
US 2023/0006044 A1   Jan. 5, 2023

(30) Foreign Application Priority Data
Dec. 26, 2019   (CN) ............................ 201911370082

(51) Int. Cl.
*H01L 21/00* (2006.01)
*H01L 29/06* (2006.01)
*H01L 29/16* (2006.01)
*H01L 29/66* (2006.01)
*H01L 29/78* (2006.01)

(52) U.S. Cl.
CPC ...... *H01L 29/1608* (2013.01); *H01L 29/0638* (2013.01); *H01L 29/0696* (2013.01); *H01L 29/66068* (2013.01); *H01L 29/7806* (2013.01)

(58) Field of Classification Search
CPC ............. H01L 29/1608; H01L 29/0638; H01L 29/0696; H01L 29/66068; H01L 29/7806
See application file for complete search history.

(56) References Cited

U.S. PATENT DOCUMENTS

2018/0122933 A1*   5/2018   Matocha ........... H01L 29/66068
2022/0406929 A1*   12/2022   Wang .................. H01L 29/0696

* cited by examiner

*Primary Examiner* — Richard A Booth

(57) ABSTRACT

A cell structure of a silicon carbide MOSFET device, comprising a drift region (3) located on a substrate layer (2), a second conducting type well region (4) and a first JFET region (51) that are located in the drift region (3), an enhancement region located within a surface of the well region (4), a gate insulating layer (8) located on a first conducting type enhancement region (6), the well region (4) and the first JFET region (51) and being in contact therewith at the same time, a gate (9) located on the gate insulating layer, source metal (10) located on the enhancement region, Schottky metal (11) located on a second conducting type enhancement region (7) and the drift region (3), a second JFET region (52) located on a surface of the drift region (3) between the Schottky metals (11), and drain metal (12).

11 Claims, 7 Drawing Sheets

CELL STRUCTURE OF SILICON CARBIDE MOSFET DEVICE, AND POWER SEMICONDUCTOR DEVICE

The present disclosure claims the priority of Chinese patent application CN201911370082.8, filed on Dec. 26, 2019 and entitled "Cell structure of silicon carbide MOSFET device, and power semiconductor device", which is incorporated herein by reference in its entirety.

FIELD OF THE INVENTION

The embodiments relate to the technical field of power semiconductor devices, and in particular to a silicon carbide metal-oxide-semiconductor field effect transistor (MOSFET) device integrated with a Schottky barrier diode (SBD), and a cell structure thereof.

BACKGROUND OF THE INVENTION

With the development of energy conservation and emission reduction, new energy gate connection and the smart gate, more and more attention has been paid to the third-generation semiconductor silicon carbide (SiC) power device, the main advantage of which is that the breakdown electric field strength is ten times of that of a traditional silicon device, or that the specific on-resistance is almost a thousandth of that of the silicon device in the same voltage/current level. The switching frequency of the SiC device is 20 times of that of the silicon device, which can reduce the volume of an energy storage element in a circuit. In theory, the SiC device can operate in a high-temperature environment above 600° C., and has excellent anti-radiation performance, which can greatly improve the reliability of a system.

However, the bipolar degradation phenomenon in a silicon carbide bipolar device, which is limited by existing manufacturing technology, will result in a significant decrease of the life of a carrier of the device, and make the voltage drop and the reverse bias leakage current of the device increase, which is inconducive to the reliability of the silicon carbide device. An existing MOSFET with a planar gate N-type channel structure is also parasitized by one body diode, and as shown in FIG. 1, comprises: an N+ substrate layer 101, an N− drift region 102, a P well region 103, an N+ source region 104, a P+ region 105, a JFET region 106, a gate oxide layer 107, gate polysilicon 108, source metal 109, drain metal 110 and a body PIN diode 111.

When the MOSFET is reverse biased, it is necessary to use a SBD in an anti-parallel manner with the MOSFET as a free wheeling diode of the MOSFET in order to inhibit the bipolar degradation caused by the turning on the body diode. In normal cases, connecting an SBD in an anti-parallel manner in a chip level will increase the cost of module encapsulation, and will introduce an additional bonding wire and stray inductance at the SBD end resulting in the decrease of the electrical performance of the module.

Therefore, it is necessary to provide a new MOSFET device in order to improve the above-mentioned technical problems.

SUMMARY OF THE INVENTION

In order to solve the above-mentioned problems in some cases, the embodiments of the present disclosure provide a silicon carbide metal-oxide-semiconductor field effect transistor (MOSFET) device integrated with an SBD, and provide a cell structure of the silicon carbide MOSFET device.

The embodiments of the present disclosure provide a cell structure of a silicon carbide MOSFET device, the cell structure including a first conducting type drift region located on a first conducting type substrate layer; a second conducting type well region and a first JFET region, which are transversely adjacent to each other along a surface of the cell structure, and are arranged within a surface of the drift region at one end transversely extending along the surface of the cell structure; an enhancement region, which is arranged within a surface of the well region at a side of the well region that is away from the first JFET region, the enhancement region including a first conducting type enhancement region and a second conducting type enhancement region, which are transversely adjacent to each other along the surface of the cell structure, wherein the first conducting type enhancement region is closer to the first JFET region than the second conducting type enhancement region; a gate insulating layer, which is arranged on the first conducting type enhancement region, a surface of the well region that is not covered by the enhancement region, and the first JEFT region, and is in contact therewith at the same time, and a gate, which is arranged on the gate insulating layer; source metal, which is arranged on the enhancement region, wherein the source metal forms ohmic contact with the enhancement region therebelow, and is not in contact with the drift region and the gate; Schottky metal, which is arranged on a surface of the drift region, which is not covered by the well region and the second JEFT region, at the other end transversely extending along the surface of the cell structure, wherein the Schottky metal forms Schottky contact with the drift region therebelow; and drain metal, which is located below the substrate.

The embodiments of the present disclosure also provide a silicon carbide MOSFET device, including the cell structure of the silicon carbide MOSFET device in the above content.

Other features and advantages of the present disclosure will be described in the following description, and some will become obvious from the description, or understood by implementing the present disclosure. The purpose and other advantages of the present disclosure are realized and obtained by the structures specifically pointed out in the description, the claims and the accompanying drawings.

BRIEF DESCRIPTION OF THE DRAWINGS

The accompanying drawings are used to provide a further understanding of the present disclosure and constitute a part of the description. The accompanying drawings together with the embodiments of the present disclosure are used to explain the present disclosure and do not constitute a limitation on the present disclosure. In the accompanying drawings.

DETAILED DESCRIPTION OF THE EMBODIMENTS

In order to make the objectives, technical solutions and advantages of the present disclosure clearer, the present disclosure will be described in details below in conjunction with the accompanying drawings, so that the implementation process of how to apply technical means to solve technical problems and realize technical effects can be fully understood and implemented accordingly. It should be noted that the embodiments in the present disclosure and the features in the embodiments can be combined with each other as long as it's within the spirit and principles of the present disclosure and there is no conflict, and any modifications, equivalent replacements, improvements, etc. made by those skilled in the art should be within the scope of protection of the present disclosure.

First Embodiment

Figure 1:
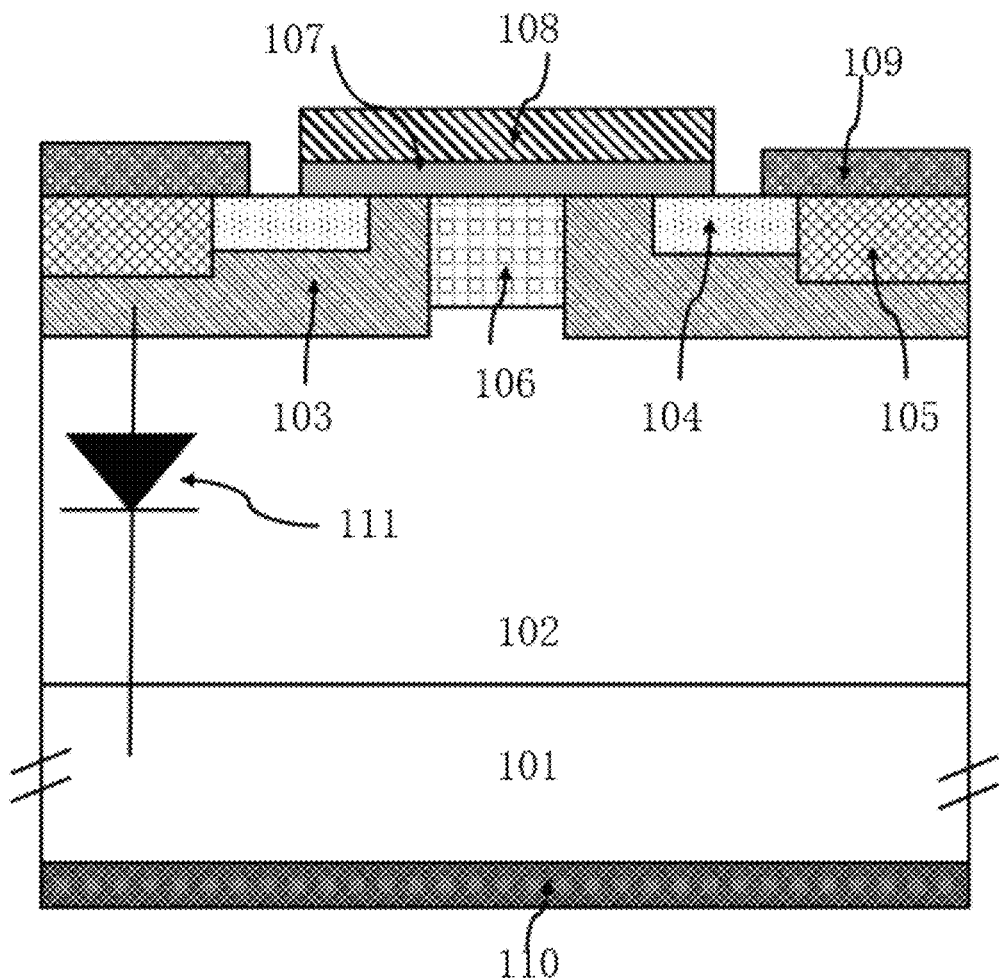
FIG. 1 shows a sectional view of a traditional planer gate N-channel-type MOSFET and a parasitic body diode structure.
Figure 2:
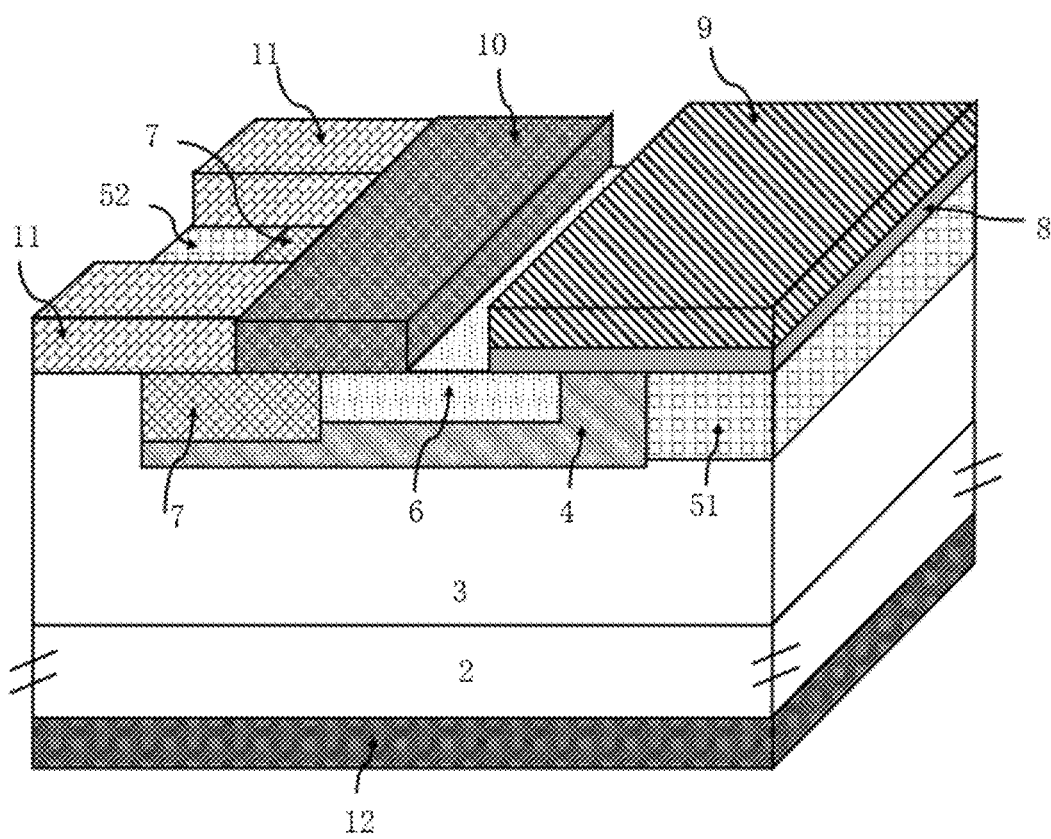
FIG. 2 is a schematic diagram of a cell structure of a three-dimensional MOSFET device integrated with an SBD in embodiments of the present disclosure.

FIG. 2 is a schematic diagram of a cell structure of a three-dimensional MOSFET device integrated with an SBD in the embodiment, and as shown in FIG. 2, the cell structure comprises: a first conducting type substrate layer 2, a first conducting type drift region 3, a second conducting type well region 4, a first JFET region 51, a second JFET region 52, a first conducting type enhancement region 6, a second conducting type enhancement region 7, a gate insulating layer 8, a gate 9, source metal 10, Schottky metal 11 and drain metal 12.

Figure 3:
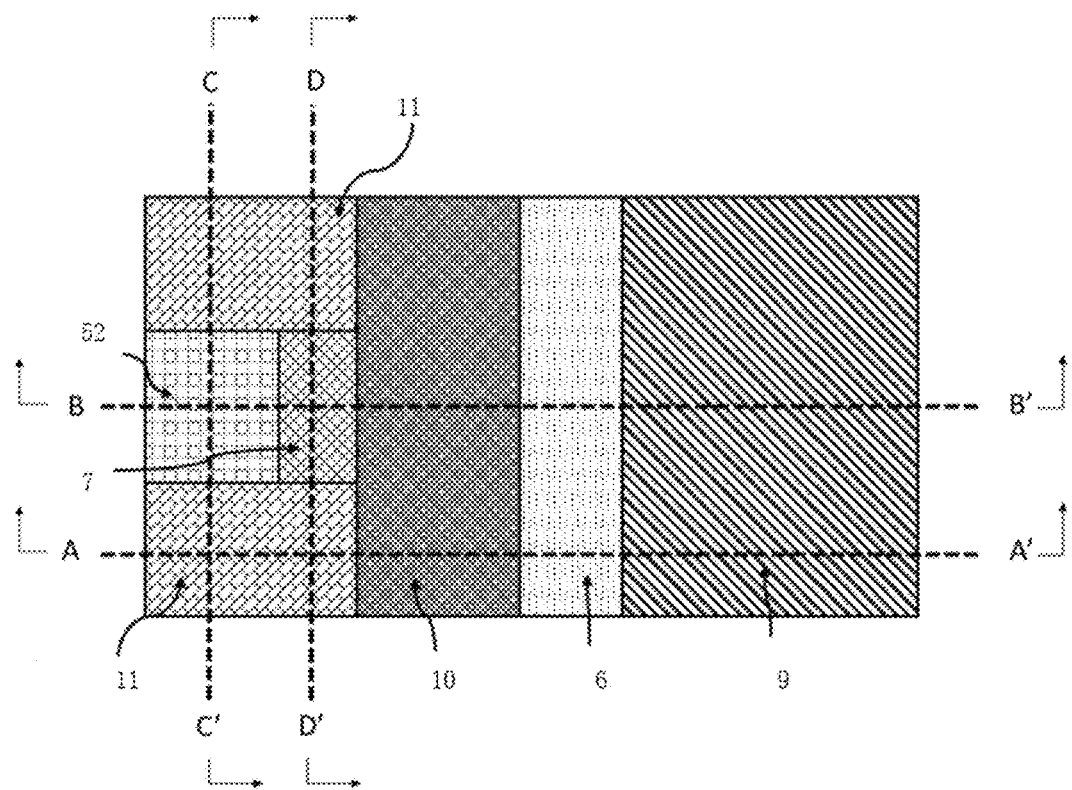
FIG. 3 is an overall top view of a cell structure of a three-dimensional MOSFET device integrated with an SBD in the embodiments of the present disclosure.
Figure 4:
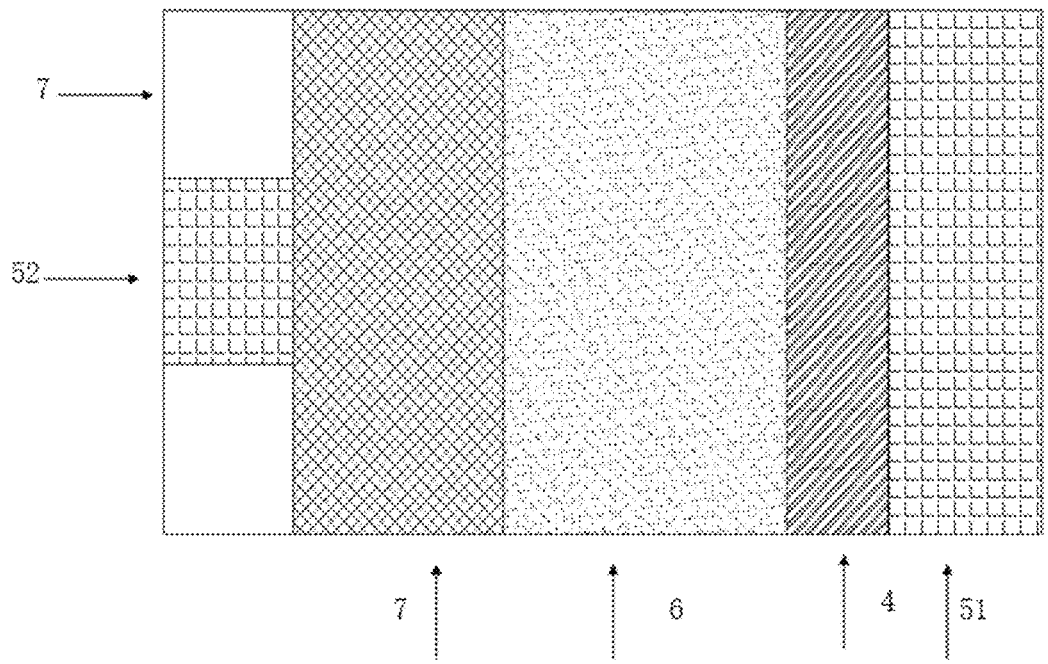
FIG. 4 is a cutaway top view of a drift region surface of the cell structure of the MOSFET device in the embodiments of the present disclosure.
Figure 5:
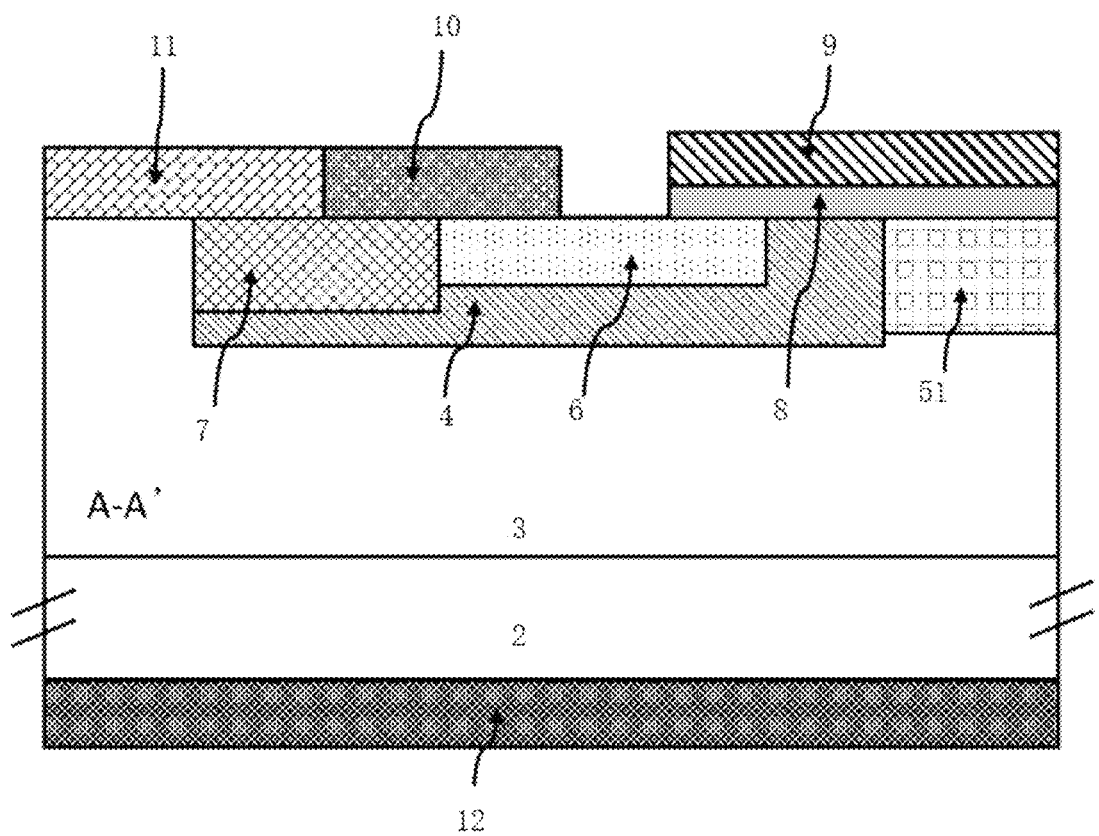
FIG. 5 is an A-A' cutaway view of a cell structure of a three-dimensional MOSFET integrated with an SBD in the embodiments of the present disclosure.
Figure 6:
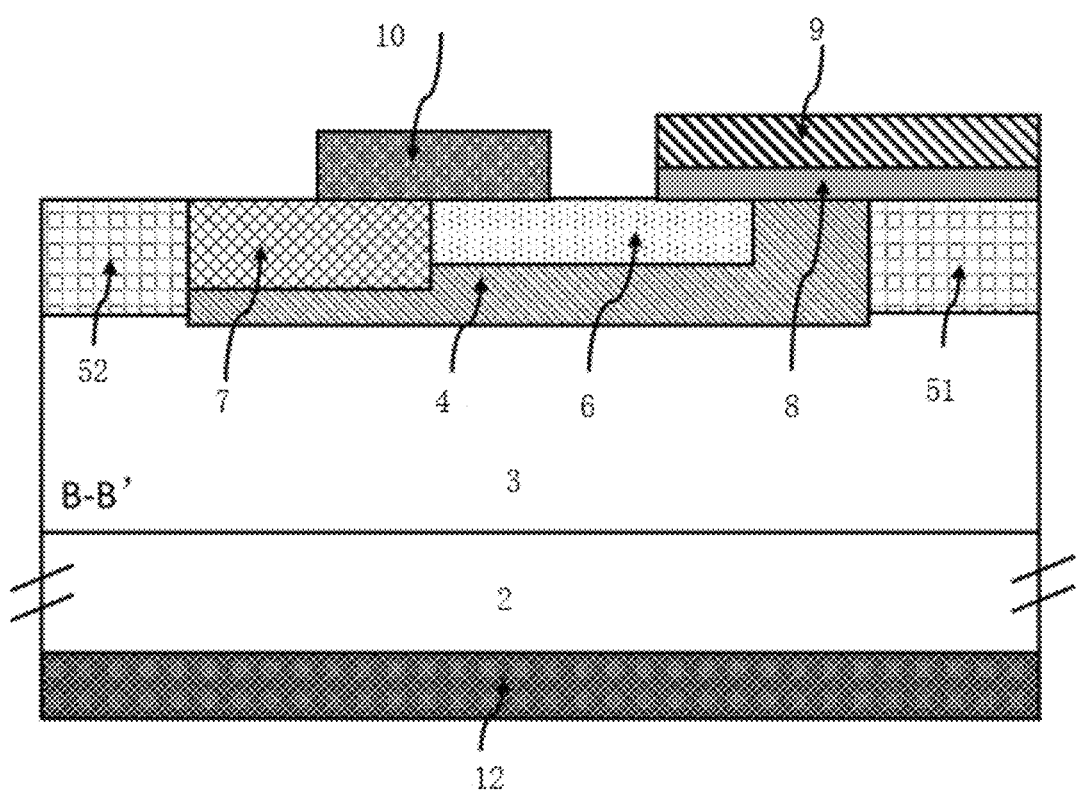
FIG. 6 is a B-B' cutaway view of a cell structure of a three-dimensional MOSFET integrated with an SBD in the embodiments of the present disclosure.
Figure 7:
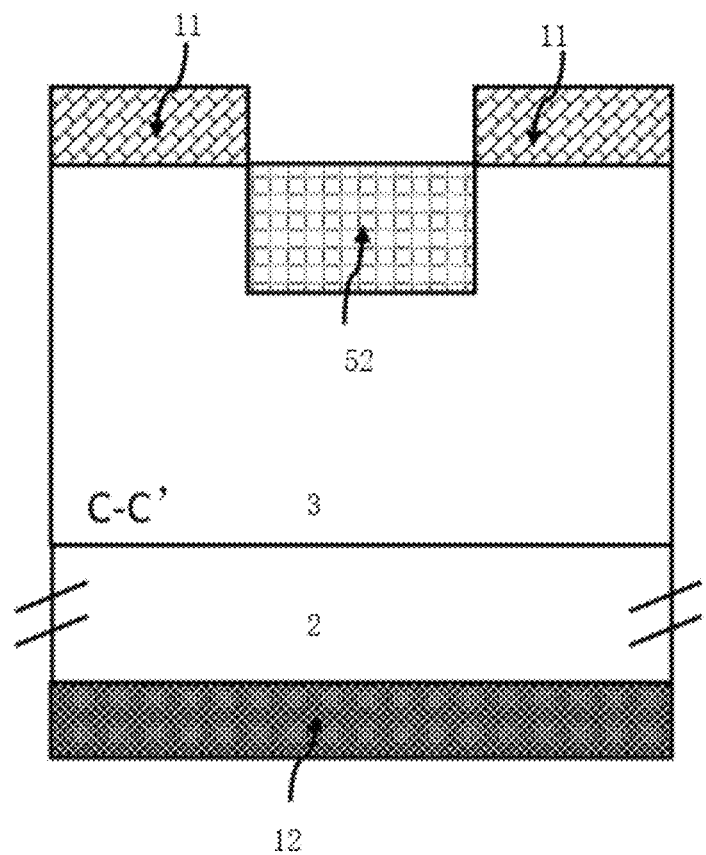
FIG. 7 is a C-C' cutaway view of a cell structure of a three-dimensional MOSFET integrated with an SBD in the embodiments of the present disclosure.
Figure 8:
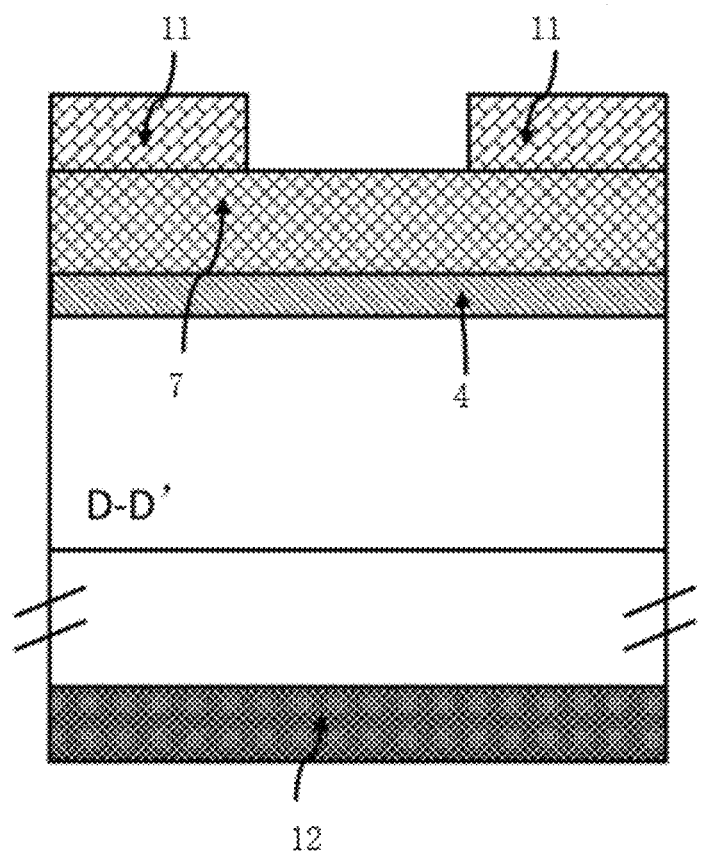
FIG. 8 is a D-D' cutaway view of a cell structure of a three-dimensional MOSFET integrated with an SBD in the embodiments of the present disclosure.

FIG. 3 is an overall top view of a cell structure of a three-dimensional MOSFET device integrated with an SBD in the embodiment of the present disclosure;

FIG. 4 is a cutaway top view of a drift region surface of the cell structure of the MOSFET device in the embodiment of the present disclosure;

FIG. 5 is an A-A' cutaway view of a cell structure of a three-dimensional MOSFET integrated with an SBD in the embodiment of the present disclosure;

FIG. 6 is a B-B' cutaway view of a cell structure of a three-dimensional MOSFET integrated with an SBD in the embodiment of the present disclosure;

FIG. 7 is a C-C' cutaway view of a cell structure of a three-dimensional MOSFET integrated with an SBD in the embodiment of the present disclosure; and FIG. 8 is a D-D' cutaway view of a cell structure of a three-dimensional MOSFET integrated with an SBD in the embodiment of the present disclosure.

In one implementation, the cell structure of the three-dimensional MOSFET device integrated with the SBD is described by taking the first JFET region 51 in a front view as a base point and a start end, with the other corresponding end being taken as a tail end. The transverse direction of the cell structure is defined as a horizontal direction of the front view, wherein the transverse start end is the rightmost end of the horizontal direction of the front view, and the transverse tail end is the leftmost end of the horizontal direction of the front view. The horizontal direction of a right view is defined as the longitudinal direction of the cell structure, wherein the longitudinal start end is the leftmost end of the horizontal direction of the right view, and the longitudinal tail end is the rightmost end of the horizontal direction of the right view.

The first conducting type substrate layer 2 in the description can comprise various semiconductor elements, such as silicon or silicon-germanium of a monocrystalline, polycrystalline or noncrystalline structure, and can also include a hybrid semiconductor structure, such as a silicon carbide semiconductor, a gallium nitride semiconductor, an indium phosphide semiconductor, a gallium arsenide semiconductor, an alloy semiconductor or a combination thereof, which is not limited herein. The first conducting type substrate layer 2 in the embodiment preferably uses a silicon carbide substrate, which may be an N-type or P-type silicon carbide substrate. In the embodiment, the N-type substrate is taken as an example for illustration.

The first conducting type in the embodiment is the N type, and the second conducting type is the P type.

JFET is short for junction field-effect transistor.

The embodiment provides a cell structure of a silicon carbide MOSFET device, the cell structure comprising: a first conducting type drift region 3 located on a first conducting type substrate layer 2; a second conducting type well region 4 and a first JFET region 51, which are transversely adjacent to each other along a surface of the cell structure, and are arranged within a surface of the drift region 3 at one end transversely extending along the surface of the cell structure; an enhancement region, which is arranged within a surface of the well region 4 at a side of the well region that is away from the first JFET region 51, the enhancement region comprising a first conducting type enhancement region 6 and a second conducting type enhancement region 7, which are transversely adjacent to each other along the surface of the cell structure, wherein the first conducting type enhancement region 6 is closer to the first JFET region 51 than the second conducting type enhancement region 7; a gate insulating layer 8, which is arranged on the first conducting type enhancement region 6, a surface of the well region 4 that is not covered by the enhancement region, and the first JEFT region 51, and is in contact therewith at the same time, and a gate 9, which is arranged on the gate insulating layer 8; source metal 10, which is arranged on the enhancement region, wherein the source metal 10 form ohmic contact with the enhancement region therebelow, and is not in contact with the drift region 3 and the gate 9; Schottky metal 11, which is arranged on a surface of the drift region 3, which is not covered by the well region 4 and the second JEFT region 52, at the other end transversely extending along the surface of the cell structure, where the Schottky metal 11 forms Schottky contact with the drift region 3 therebelow, and the Schottky metal 11 is in contact with the source metal 10 at the same time; and drain metal 12, which is located below the substrate 2.

In one implementation, the Schottky metal 11 also extends to the above of the second conducting type enhancement region 7, and forms ohmic contact with the second conducting type enhancement region 7.

In one implementation, the Schottky metal 11 is in direct contact with the source metal 10, or the Schottky metal 11 and the source metal 10 are arranged at an interval and are connected to each other via secondary metal arranged on the surface of the cell structure.

In one implementation, the second JFET region 52 is arranged within a surface of an area of the drift region 3 that is not covered by the well region 4, the second conducting type enhancement region 7 and the Schottky metal 11.

In one implementation, a boundary of the Schottky metal 11 is in contact with or close to a boundary of the second JFET region 52.

In one implementation, in the drift region 3, the first JFET region 51 and the well region 4 longitudinally extends along the surface of the cell structure to the other longitudinal end of the surface of the cell structure.

In one implementation, on a surface of the drift region 3, the enhancement region longitudinally extends along the surface of the cell structure to the other longitudinal end of the surface of the cell structure in the well region 4. Correspondingly, on a surface of the enhancement region, the source metal 10 longitudinally extends along the surface of the cell structure to the other longitudinal end of the surface of the cell structure; and on surfaces of the first JFET region 51 and the well region 4 that is not covered by the enhancement region and on a surface of the first conducting type enhancement region 6, the gate insulating layer 8 longitudinally extends along the surface of the cell structure to the other longitudinal end of the surface of the cell structure.

In one implementation, the depth of the second conducting type enhancement region 7 is greater than or equal to the depth of the first conducting type enhancement region 6.

In one implementation, the concentration of the first JFET region 51 and the concentration of the second JFET region 52 are equal to each other and are greater than the concentration of the drift region 3.

Specifically, the first conducting type drift region 3 is arranged on the first conducting type substrate layer 2. The second conducting type well region 4 and the first JFET region 51, which are transversely adjacent to each other along the surface of the cell structure, are arranged within the surface of the drift region 3 at the longitudinal start end of the surface of the cell structure. The first JFET region 51 is located at the transverse start end of the cell structure, i.e. the rightmost end of the horizontal direction of the front view of the cell structure. The second conducting type well region 4 is in contact with the first JFET region 5 in the transverse direction of the cell structure. The enhancement region is arranged within the surface of the well region 4, where the surface of the well region 4 is not completely covered by the enhancement region. The enhancement region contains the first conducting type enhancement region 6 and the second conducting type enhancement region 7, where the first conducting type enhancement region 6 and the second conducting type enhancement region 7 are adjacent to and in contact with each other in the transverse direction of the cell structure, and the first conducting type enhancement region 6 is closer to the first JFET region 51 than the second conducting type enhancement region 7, and the second conducting type enhancement region 7 is located at the transverse tail end of the cell structure that is away from the first JFET region 51, i.e. the leftmost end of the horizontal direction of the front view of the cell structure. In the drift region 3, the first JFET region 51 and the well region 4 extends from the longitudinal start end of the surface of the cell structure to the longitudinal tail end of the surface of the cell structure.

On the surface of the drift region 3, the second conducting type enhancement region 7 extends along the surface of the cell structure from the longitudinal start end of the cell structure to the longitudinal tail end of the cell structure in the well region 4, that is, extending from the leftmost end of the horizontal direction of the right view of the cell structure to the rightmost end thereof.

In one implementation, a MOSFET device contains a first conducting type substrate 2 having a higher concentration, with the concentration range being $1\times10^{18}$ to $1\times10^{19}$ cm$^{-3}$. A first conducting type drift region 3 is arranged on the first conducting type substrate 2. The concentration range of the drift region 3 is $1\times10^{14}$ to $5\times10^{16}$ cm$^{-3}$, and the specific concentration can be optimally set according to a withstand voltage requirement of the device. The concentration range of a second conducting type well region 4 is set to be $1\times10^{16}$ to $5\times10^{18}$ cm$^{-3}$; the concentration ranges of a first JFET region 51 and a second JFET region 52 are set to be $1\times10^{15}$ to $5\times10^{17}$ cm$^{-3}$, and the concentration of the two JFET regions is set to be higher than the concentration of the drift region 3, which is conducive to ameliorating a silicon carbide bipolar degradation phenomenon, and improving the reliability of the device; and the concentration ranges of the enhancement regions in a cell structure are both set to be greater than $1\times10^{19}$ cm$^{-3}$, and the depth of the second conducting type enhancement region 7 is set to be greater than the depth of the first conducting type enhancement region 6.

In one implementation, the thickness of a gate insulating layer 8, which is located above the first JFET region 51, the second conducting type well region 4 and the first conducting type enhancement region 6 and is in contact with them at the same time, is set to be greater than or equal to 50 nm. A gate 9 is deposited on the gate insulating layer 8, the doping type of the gate is N type, the material of the gate is set as metal or polysilicon, and the concentration of the gate 9 is greater than or equal to $1\times10^{18}$ cm$^{-3}$. The gate 9 and source metal 10 are isolated by a highly insulating interlayer dielectric layer. On a surface of the well region 4, the first conducting type enhancement region 6 is provided to extend along the surface of the cell structure from the longitudinal start end towards the longitudinal tail end, that is, extending from the leftmost end of the right view of the cell structure towards the right end thereof, and in the embodiment, extending all the way to the longitudinal tail end of the cell structure.

The source metal 10 which is used for forming ohmic contact is provided on the enhancement region. The source metal 10 is in contact with the first conducting type enhancement region 6 and the second conducting type enhancement region 7 at the same time, but is not in contact with the drift region 3. The source metal 10 is also not in contact with the gate insulating layer 8 and the gate 9. The source metal 10 extends along the surface of the cell structure from the longitudinal start end to the longitudinal tail end, that is, extending from the leftmost end of the right view of the cell structure to the rightmost end thereof. The ohmic contact material of the source metal is set to be metal or alloy having low contact resistivity, and preferably aluminum, nickel or aluminum-nickel alloy.

At the transverse tail end of the cell structure, i.e. the leftmost end of a front view of the cell structure, the second JFET region 52 is provided on a surface of the drift region 3 that is not covered by the well region 4, Schottky metal 11 is provided on a surface of the drift region 3 that is not covered by the well region 4 and the second JFET region 52, and a surface of the second conducting type enhancement region 7 that is not covered by the source metal 10, and the Schottky metal 11 forms low barrier Schottky contact with the drift region 3 therebelow, and forms ohmic contact with the second conducting type enhancement region 7, thereby reducing the on-resistance of a part of an SBD. The Schottky metal 11 is in contact with the source metal 10 at the same time, and a contact position of the Schottky metal 11 with the source metal 10 is located above the second conducting type enhancement region 7. At the other end transversely extending along the surface of the cell structure, the second JFET region 52 is provided at a middle position of the surface of the drift region 3 that is not covered by the well region 4. At the other end transversely extending along the surface of the cell structure, the surface of the drift region that is not covered by the second JFET region and the second conducting type enhancement region is divided into at least two parts by the second JFET region. In the embodiment, correspondingly, the Schottky metal is also dividedly provided as at least two parts. The contact material of the Schottky metal is provided to be metal or alloy having low contact resistivity, and preferably titanium, aluminum, nickel or alloy composed of titanium, aluminum and nickel of any components.

On the surface of the drift region 3, the enhancement region extends from the longitudinal start end of the surface of the cell structure to the longitudinal tail end of the surface of the cell structure in the well region 4. Correspondingly, on the surfaces of the first JFET region 51 and the well region 4 that is not covered by the enhancement region and on the surface of the first conducting type enhancement region 6, the gate insulating region 8 extends from the longitudinal start end of the surface of the cell structure to the longitudinal tail end of the surface of the cell structure, and on the surface of the enhancement region. The source metal 10 extends from the longitudinal start end of the surface of the cell structure to the longitudinal tail end of the surface of the cell structure on the surface of the enhancement region.

The Schottky metal 11 and a doped area of the second JFET region 52 are provided at an interval in a staggered manner, and the boundary of the Schottky metal 11 can be provided to be in contact with or close to the boundary of the doped area of the second JFET region 52, which can reduce the on-resistance of the SBD. There is no JFET doped region being provided below the Schottky metal, and therefore, a leakage current appearing when the SBD is reverse biased can be reduced, so as to realize a better compromise relationship between the on-resistance of the SBD and a reverse bias leakage current thereof.

In one implementation, in the drift region 3, the first JFET region 51 and the well region 4 extends from the longitudinal start end of the surface of the cell structure to the longitudinal tail end of the surface of the cell structure. The SBD is integrated in a JFET region of a MOSFET cell structure, and thus, the utilization rate of the area of the device is improved, thereby increasing the overall power density of the device.

Drain metal 12 is also provided below the substrate 2.

The drain metal 12, the first conducting type substrate layer 2, the first conducting type drift region 3, the second conducting type well region 4 and the Schottky metal 11 form the SBD built in the MOSFET cell, which can be used as a free wheeling diode when the MOSFET is reverse biased, such that it is not necessary to additionally encapsulate an SBD when encapsulating a MOSFET module, thereby reducing the encapsulation cost of the device, and also reducing parasitic inductance generated by a bonding wire. Moreover, since the SBD is integrated in a cell, a turn-on voltage of a body diode of the MOSFET device is increased, an electrical property degradation condition of the MOSFET device is ameliorated, and the reliability of the device is improved.

In addition, according to the specific application condition of the device or on the basis of consideration of a different design, the Schottky metal 11 can also be provided to cover the source metal 10 for connection, or the Schottky metal 11 is provided to be spaced apart from the source metal 10 and connected thereto via secondary metal on the surface of the cell structure.

In summary 1. the embodiment provides a silicon carbide MOSFET cell structure with a three-dimensional structure, where an SBD is integrated in a cell level to serve as a free wheeling diode when a device is reverse biased, such that the turning on of a body diode is effectively inhibited, the electrical property degradation condition of the MOSFET device is ameliorated, and the reliability of the device is improved; and 2. in the embodiment, the SBD is integrated between P+ enhancement regions of the MOSFET cell structure, and the SBD part and the MOSFET part share part of the area of an active region and a terminal region, such that the utilization rate of the area of the device is increased, and the overall power density of the device is increased; and moreover, Schottky metal and a JFET doped area are arranged at an interval in a three-dimensional direction, such that the distribution of each areas is optimized, and the on-resistance of the SBD and the leakage current appearing when the SBD is reverse biased are reduced, thereby realizing a better compromise relationship.

Second Embodiment

The invention further provides a silicon carbide MOSFET power semiconductor device. The power semiconductor device is provided with several cell structures of any one silicon carbide MOSFET device in the content above, wherein the shape of the cell structure is strip-shaped, quadrilateral or hexagonal.

In summary 1. in the embodiment, gates of an MOSFET device are arranged spaced apart from each other, which is conducive to reducing the parasitic capacitance of a chip; and 2. in the embodiment, an SBD is integrated in a cell, such that it is not necessary to additionally encapsulate an SBD when encapsulating a module, thereby reducing the parasitic inductance of a bonding wire and the encapsulation cost of the module.

It should also be noted that the directional terms used in the embodiment, such as "above", "below", "front", "rear", "left", "right", etc., merely indicate directions in the accompanying drawings, and are not intended to limit the scope of protection of the present disclosure. When it is possible to cause confusion in the understanding of the present disclosure, the conditional structure or construction will be omitted. Moreover, The shape and the size of each component in the figures do not reflect the real dimension and scale, and merely illustrate the contents of the embodiments of the present disclosure. In addition, in the claims, any reference signs placed in parentheses should not be construed as limitations on the claims. Unless known to the contrary, the numerical parameters set forth herein and in the appended claims are approximations that can vary depending upon the desired properties obtained through the contents herein. Specifically, all the numbers used in the description and the claims for representing compositional contents, reaction conditions, etc., should be understood as being modified by the term "about" in all cases. In general, the meaning expressed is meant to comprise a change of ±10% in some embodiments, a change of ±15% in some embodiments, a change of ±1% in some embodiments, and a change of ±0.5% in some embodiments on a specific quantity basis. Furthermore, the term "contain" does not exclude the presence of elements or steps not listed in claims. The term "a" or "an" in front of an element does not exclude the presence of a plurality of such elements.

The implementations disclosed by the present disclosure are as stated above, but the content is only the implementations used for facilitating the understanding of the present disclosure, rather than used for limiting the present disclosure. Any person skilled in the art described in the present disclosure can make any modification and change to the form and details of the implementation without departing from the spirit and scope of the present disclosure, and the protection scope of the present disclosure is not limited to the particular embodiments disclosed by the present disclosure, but covers all the technical solutions falling in the scope of the claims.

The invention claimed is:

1. A cell structure of a silicon carbide MOSFET device, wherein the cell structure comprises:
   a first conducting type drift region located on a first conducting type substrate layer;
   a second conducting type well region and a first JFET region, which are transversely adjacent to each other along a surface of the cell structure, and are arranged within a surface of the drift region at one end transversely extending along the surface of the cell structure;
   an enhancement region, which is arranged within a surface of the well region at a side of the well region that is away from the first JFET region, the enhancement region comprising a first conducting type enhancement region and a second conducting type enhancement region, which are transversely adjacent to each other along the surface of the cell structure, wherein the first conducting type enhancement region is closer to the first JFET region than the second conducting type enhancement region;
   a gate insulating layer, which is arranged on the first conducting type enhancement region, a surface of the well region that is not covered by the enhancement region, and the first JFET region, and is in contact therewith at the same time, and a gate, which is arranged on the gate insulating layer;
   source metal, which is arranged on the enhancement region, wherein the source metal forms ohmic contact with the enhancement region therebelow, and is not in contact with the drift region and the gate;
   Schottky metal, which is arranged on a surface of the drift region that is not covered by the well region and the second JEFT region, at the other end transversely extending along the surface of the cell structure, wherein the Schottky metal forms Schottky contact with the drift region therebelow; and
   drain metal, which is located below the substrate.

2. The cell structure of the silicon carbide MOSFET device according to claim 1, wherein
   the Schottky metal also extends to the above of the second conducting type enhancement region, and forms ohmic contact with the second conducting type enhancement region.

3. The cell structure of the silicon carbide MOSFET device according to claim 2, wherein
   the Schottky metal is in direct contact with the source metal; or
   the Schottky metal and the source metal are arranged separately and are connected to each other via secondary metal arranged on the surface of the cell structure.

4. The cell structure of the silicon carbide MOSFET device according to claim 2, wherein
   the second JFET region is provided within a surface of an area of the drift region that is not covered by the well region, the second conducting type enhancement region and the Schottky metal.

5. The cell structure of the silicon carbide MOSFET device according to claim 4, wherein
   a boundary of the Schottky metal is in contact with or close to a boundary of the second JFET region.

6. The cell structure of the silicon carbide MOSFET device according to claim 2, wherein
   in the drift region, the first JFET region and the well region longitudinally extends along the surface of the cell structure to the other longitudinal end of the surface of the cell structure.

7. The cell structure of the silicon carbide MOSFET device according to claim 2, wherein
   on the surface of the drift region, the enhancement region longitudinally extends along the surface of the cell structure to the other longitudinal end of the surface of the cell structure in the well region, and correspondingly, on the surface of the enhancement region, the source metal longitudinally extends along the surface of the cell structure to the other longitudinal end of the surface of the cell structure, and on surfaces of the first JFET region and the well region that is not covered by the enhancement region and on the surface of the first conducting type enhancement region, the gate insulating layer longitudinally extends along the surface of the cell structure to the other longitudinal end of the surface of the cell structure.

8. The cell structure of the silicon carbide MOSFET device according to claim 1, wherein
   a depth of the second conducting type enhancement region is greater than or equal to a depth of the first conducting type enhancement region.

9. The cell structure of the silicon carbide MOSFET device according to claim 1, wherein concentrations of the first JFET region and the second JFET region are equal to each other and greater than a concentration of the drift region.

10. The cell structure of the silicon carbide MOSFET device according to claim 9, wherein
    a concentration range of the substrate is $1\times10^{18}$ to $1\times10^{19}$ $cm^{-3}$;
    the concentration range of the drift region is $1\times10^{14}$ to $5\times10^{16}$ $cm^{-3}$;
    a concentration range of the well region is $1\times10^{16}$ to $5\times10^{18}$ $cm^{-3}$;
    the concentration ranges of the first JFET region and the second JFET region are $1\times10^{15}$ to $5\times10^{17}$ $cm^{-3}$;
    a concentration of the enhancement region is greater than $1\times10^{19}$ $cm^{-3}$; and
    a concentration of the gate is greater than or equal to $1\times10^{18}$ $cm^{-3}$.

11. A silicon carbide MOSFET power semiconductor device, wherein the power semiconductor device is provided with several cell structures of the silicon carbide MOSFET device according to claim 1, wherein a shape of the cell structure is strip-shaped, quadrilateral or hexagonal.

* * * * *